(12) United States Patent
Matsumura

(10) Patent No.: US 6,570,233 B2
(45) Date of Patent: May 27, 2003

(54) METHOD OF FABRICATING AN INTEGRATED CIRCUIT

(75) Inventor: Akira Matsumura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/901,071

(22) Filed: Jul. 10, 2001

(65) Prior Publication Data

US 2002/0079580 A1 Jun. 27, 2002

(30) Foreign Application Priority Data

Dec. 27, 2000 (JP) ........................................ 2000-398132

(51) Int. Cl.$^7$ ..................... H01L 21/338; H01L 21/425; H01L 31/119
(52) U.S. Cl. ..................... 257/385; 257/335; 257/342; 257/381; 257/382; 257/610; 257/611; 438/185; 438/307; 438/514; 438/519; 438/532; 438/657; 438/684
(58) Field of Search ..................... 257/215, 219, 257/244, 288, 327, 335, 342, 349, 381, 382, 385, 396, 610, 611; 438/185, 307, 229–233, 514–516, 519, 523, 525, 524, 529, 657, 532, 533, 584

(56) References Cited

U.S. PATENT DOCUMENTS 5,792,695 A * 8/1998 Ono et al.
5,801,087 A * 9/1998 Manning et al.
6,316,799 B1 * 11/2001 Kunikiyo

* cited by examiner

*Primary Examiner*—Ha Tran Nguyen
(74) *Attorney, Agent, or Firm*—McDermott, Will & Emery

(57) ABSTRACT

The invention provides a technology for reducing the direct contact resistance and for reducing the junction leak while maintaining the punch through margin. A semiconductor integrated circuit device is provided which comprises: a substrate; a transistor formed on the substrate, which comprises a source, a drain and a gate which controls a current flowing from said source to said drain; and a contact plug being electrically connected to at least one of the source and drain and made of a conductive material including a dopant. The contact plug is formed of at least a first layer and a second layer. The first layer contacts with one of the source and drain and is made of said material including the dopant of a first concentration. The second layer is formed of a layer of said material including the dopant of a second concentration, which is lower than the second concentration.

12 Claims, 6 Drawing Sheets

METHOD OF FABRICATING AN INTEGRATED CIRCUIT

BACKGROUND OF THE INVENTION

1. Field of the Invention

The present invention relates to a technology for processing a bit line contact and a storage node contact used mainly in each element of a dynamic random access memory.

2. Description of the Prior Art

FIG. 12 shows a silicon substrate 120 wherein polyplugs 125-1 and 125-2 are formed by means of a conventional process. The polyplug 125-1 secures a contact for an electrode (storage node) of a memory capacitor which stores data as a memory element of, for example, a dynamic random access memory (hereinafter referred to as DRAM) and the polyplug 125-2 secures a contact with a bit line.

As for a brief description of a process for the silicon substrate 120, first, transistors are formed on the silicon substrate 120. In the figure a gate electrode 121 is shown as a part of a transistor. Then, sidewalls 122 and an insulating interlayer film 123 are formed and two contact holes are created on both sides of the gate electrode 121 through SAC (self-aligned contact) etching. After the contact holes are created, phosphorous (P) is injected therein in an SAC manner so as to form n⁻ regions 124-1 and 124-2. Finally, polyplugs 125-1 and 125-2 are formed by depositing phosphorous (P) doped polysilicon in these contact holes.

A problem arises that, together with the miniaturization of the DRAM, the plug diameter of the contact plugs of the memory cells are scaled down so as to lower the current drive performance (Ids) of the DRAM. This is because the direct contact resistance between the polyplugs and the n⁻ regions increases.

In addition, since the n⁻ regions 124-1 and 124-2 are formed in the proximity of each other according to a conventional process, the punch through margin in the channel direction cannot be sufficiently provided. As for a more concrete description, at the time when the n⁻ regions 124-1 and 124-2 are formed in the silicon substrate by injecting phosphorous (P) in an SAC manner, the n⁻ regions diffuse in the lateral direction (channel direction) along which the gate electrode 121 exists. Therefore, the n⁻ regions are formed in the proximity of each other so as to have a risk of causing a punch through. Here "punch through" is a phenomenon where a current continues to flow between the source and the drain due to the connection between the drain depletion layer and the source depletion layer as a result of the drain depletion layer approaching too closely to the source in the transistor. Accordingly, the "punch through margin" is a safety margin which prevents a punch through from occurring.

In addition, the fact that the punch through margin cannot be sufficiently provided means that the SAC injection of phosphorous (P) cannot be carried out at a higher energy level. This is because, in the case that the SAC injection is carried out at a high energy level, the diffusion of the n⁻ regions in the channel direction becomes far greater. In view of the fact that a leak, through the PN junctions between the P-well and the n⁻ regions, is reduced through SAC injection at a higher energy level, the performance of the DRAM cannot be further increased according to a conventional process.

In the case that the performance of the memory cell transistor is lowered, as described above, the margin for writing in or reading out data of a DRAM is also lowered so as to greatly influence the refresh characteristics (mainly refresh cycle time).

SUMMARY OF THE INVENTION

An object of the present invention is to reduce the direct contact resistance and to reduce a junction leak by carrying out SAC injection at a high energy level while maintaining the punch through margin.

A semiconductor integrated circuit device according to the present invention comprises a contact plug which is electrically connected to at least one of the source and the drain and which is made a conductive material including a dopant. The contact plug is formed of at least a first layer and a second layer. The first layer contacts with one of said source and drain and is made of said material including the dopant of a first concentration; said second layer is formed of a layer of said material including the dopant of a second concentration. The first concentration is higher than said second concentration. Since the first layer (high concentration phosphorous (P) doped polysilicon layer) exists on the interface with the substrate so as to contact the source and the drain, the concentration of the material of the substrate interface rises and, thereby, the direct contact resistance can be lowered.

One of said source and drain may be a region into which ions are injected with a first energy level and with a second energy level, which is higher than the first energy level, and the ions injected with said second energy level may be ions injected via said first layer. An ion injection with a high energy can be implemented for reducing the junction leak while maintaining the punch through margin in the channel direction.

A recess is formed in one of said source and drain of said substrate and the ions injected with said second energy level may be ions injected further via said recess. The ions enter into a deeper position in the substrate so that the junction leak can be reduced.

BRIEF DESCRIPTION OF THE DRAWINGS

These and other object and features of the present invention will become clear from the following description taken in conjunction with the preferred embodiments thereof with reference to the accompanying drawings, in which.

DETAILED DESCRIPTION OF THE PREFERRED EMBODIMENTS

Preferred embodiments of the present invention will be described hereinafter by referring to the accompanying drawings.

Figure 1:
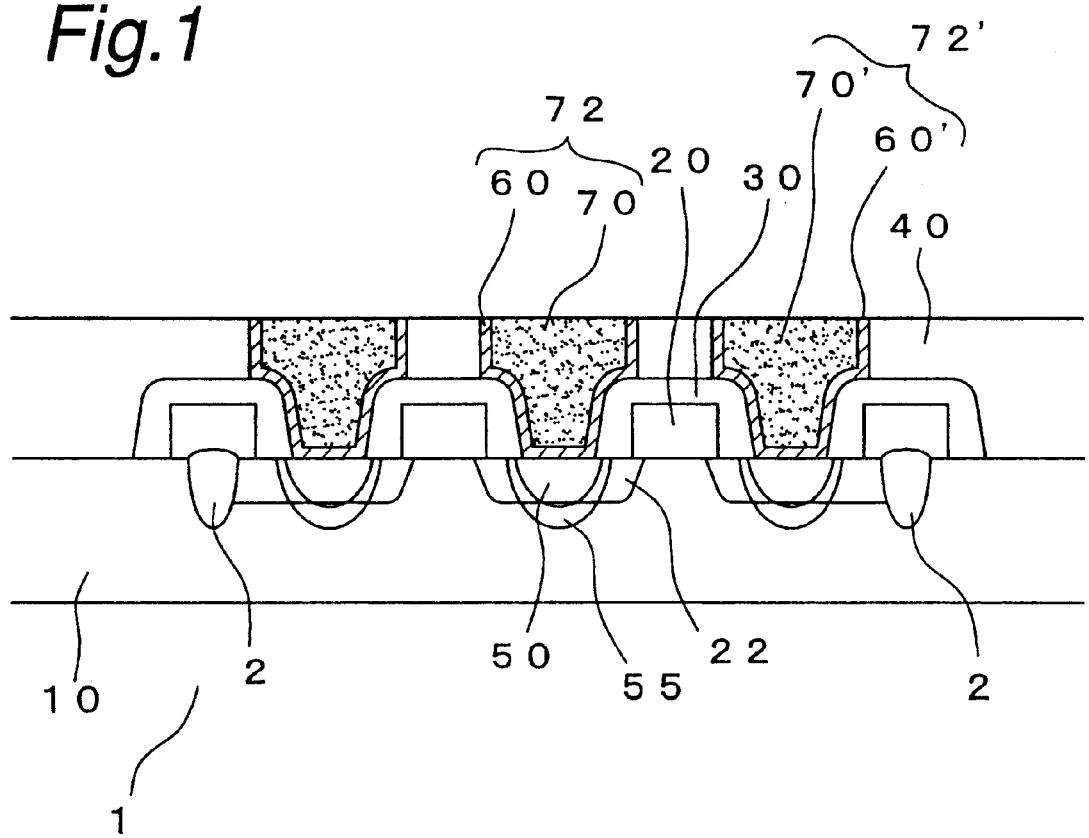
FIG. 1 is a cross sectional view of a semiconductor integrated circuit device according to Embodiment1.

FIG. 1 shows a cross sectional view of a semiconductor integrated circuit device 1 according to a first embodiment. The semiconductor integrated circuit device 1 is applicable as a dynamic random access memory (hereinafter referred to as DRAM). For example, though only transistor parts are shown in the drawing, the semiconductor integrated circuit device 1 can form memory cells of a DRAM together with other components (bit lines, word lines, memory capacitors, or the like), which are not shown either.

The characteristics of the semiconductor integrated circuit device 1 according to the present embodiment are the formation of a contact plug 72 of phosphorous (P) doped polysilicon made of a thin layer 60 which contacts with the substrate 10 and which is made of a material that includes a dopant of high concentration and a layer 70 made of a material that includes a dopant of a conventional concentration. Thereby, since the phosphorous concentration in the substrate interface rises, the direct contact resistance can be lowered. In addition, after forming a thin layer 60, phosphorous (P) ions are injected in a self-aligned contact (hereinafter referred to as SAC) manner at a high energy level via that layer 60 and, therefore, the punch through margin in the channel direction can be maintained so as to reduce the junction leak. Here, "junction leak" as used in the present specification is a current leak from PN junctions between the P-well within a memory cell and n$^-$ regions forming a source and a drain of a transistor.

The semiconductor integrated circuit device 1 includes a P type silicon substrate 10, a plurality of transistors, element isolation regions 2, sidewalls 30, an interlayer film 40 and contact plugs 72. In the following, each component is described.

Phosphorous (P) ions are injected (SAC injection) twice at different energy levels into the substrate 10. SAC injection means to inject impurities using the already created contact parts, in a self-aligning manner, as a mask. By injecting impurities, the surface resistance of the contact plugs can be reduced. According to SAC injection the margin for adjusting mask position can be made small so that the circuit can be miniaturized. Because of the two ion injections, the n$^-$ region 50, formed through the injection at a conventionally used energy level in a prior art, and the n$^-$ region 55, which is formed through the injection at a higher energy level than in a prior art, exist in the substrate 10. The formation process of n$^-$ region 50 and 55 is described later.

The plurality of transistors are N channel type metaloxide semiconductor field effect transistors (N channel type MOSFET) in the specification. These transistors are the transistors that are provided between memory capacitor parts (not shown) which store data and bit lines (not shown) and which are for controlling data transmission and which, then, are called transfer gates. Each of the plurality of transistors includes a gate 20 and an n$^-$ region 22 as a source (or a drain). Though, for simplification, no reference symbols are attached, a region on the opposite side of the substrate 10, with the gate 20 in between, is the drain (or the source). Though a plurality of gates 20 are shown in the drawing, in the present specification the transistor with respect to the gate 20, to which the reference symbol is attached, and the n$^-$ region 22 is, mainly, focused on for description. Here, though the gate 20 is shown so as to made of a single material in the drawing, a layer of an oxide exists, of course, so as to contact with the substrate 10 and a layer of metal is deposited thereon.

The element isolation regions 2 are formed in order to electrically mutually insulate a plurality of transistors by using TEOS (tetraethyl ortho silicate), or the like.

The sidewalls 30 are an insulating film provided so as to cover the sides and the top surfaces of the gates 20. The sidewalls 30 can prevent the characteristics fluctuation of the N channel type MOSFETs due to hot carriers. The material thereof is, for example, silicon nitride (SiN).

The interlayer film 40 is an interlayer insulating film provided so that the contact plugs 72 are not electrically connected with another contact plug, or the like. The material thereof is, for example, BPTEOS (boro phospho tetra ethyl ortho silicate) which can gain flatness at a comparatively low temperature.

The contact plugs 72 secures contacts, for example, with electrodes (storage nodes) (not shown) of memory capacitors which store data as memory elements of a DRAM or contact with bit lines (not shown) of the DRAM. The contact plug 72' secures the contact with a storage node and the contact plug 72 shown to the left thereof secures the contact with a bit line (not shown). According to the present embodiment, the contact plugs are made of phosphorous (P) doped polysilicon. As described above, the contact plugs 72, 72' are formed of a thin layer 60 and 60' which contacts with the substrate 10 and which is formed with a material including a dopant of high concentration and of a layer 70 and 70' which is made of a material including a dopant of a conventional concentration. In the following, the formation process of these layers are described in reference to FIGS. 2 to 8. Here, in the following description, only the formation of the contact plug 72 in FIG. 1 is described. As shown in the figure, even in the case that a plurality of contact plugs exist, exactly the same contact plugs can be formed at the same time on the same substrate 1 by carrying out the below described process in parallel.

Figure 2:
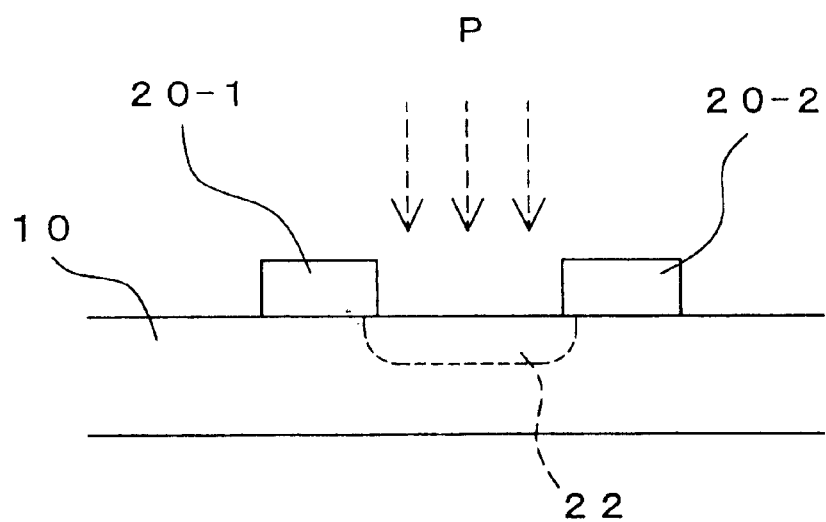
FIG. 2 is a diagram of a substrate wherein gates are formed.

FIG. 2 shows the substrate 10, wherein gates 20-1 and 20-2 are formed. The gates are formed, for example, through the below described process. First, a thin insulating film (SiO2) is deposited on the P type silicon substrate 10 and Al, Au or polycrystal silicon are, furthermore, deposited thereon. Then, the part other than the gates 20-1 and 20-2 is removed through etching. Then, next, an n region (electrode) 22, of which the impurity calculation is high, is buried in the substrate 10. For this purpose, for example, P (phosphorous) ions are utilized. Though not shown, another n$^-$ region is formed at a location closely adjoining the n$^-$ region 22. These become the source and drain, respectively, of a transistor. In this manner, the gates 20-1 and 20-2 and the source (or drain) electrode 22 are formed.

Figure 3:
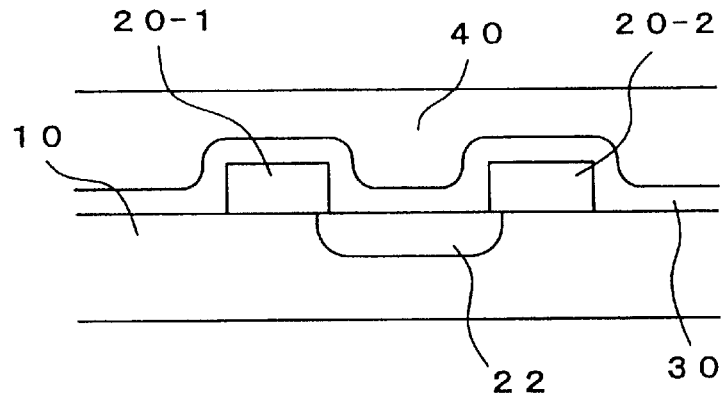
FIG. 3 is a diagram of an insulating film deposited on the gates and an interlayer film additionally deposited thereon.
Figure 4:
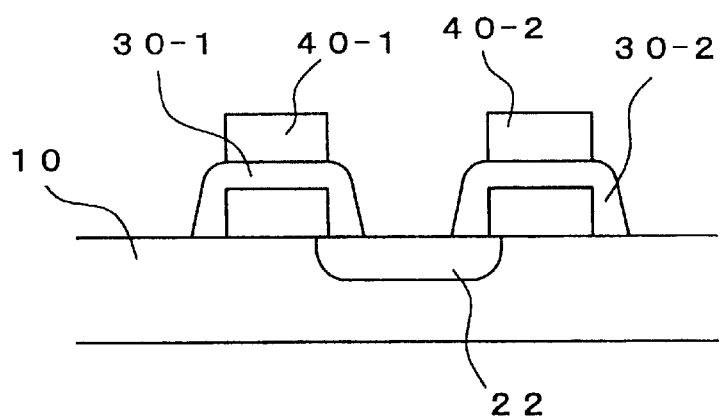
FIG. 4 is a diagram of a substrate wherein contact holes are created through lithography and SAC etching.

FIG. 3 shows an insulating film 30 which is deposited on the gates 20-1 and 20-2 and an interlayer film 40 which is, further, deposited thereon. The insulating film 30 is a film of which sidewalls 30 (FIG. 1) are afterwards formed. It is understood that the interlayer film 40 is flattened. Then, lithography and SAC etching are carried out next on such a substrate 10. FIG. 4 shows a substrate 10, wherein a contact hole is created through lithography or SAC etching. The contact hole is an area surrounded by the n⁻ region 22, the sidewalls 30-1, 30-2 and the interlayer film 40-1 and 40-2.

Figure 5:
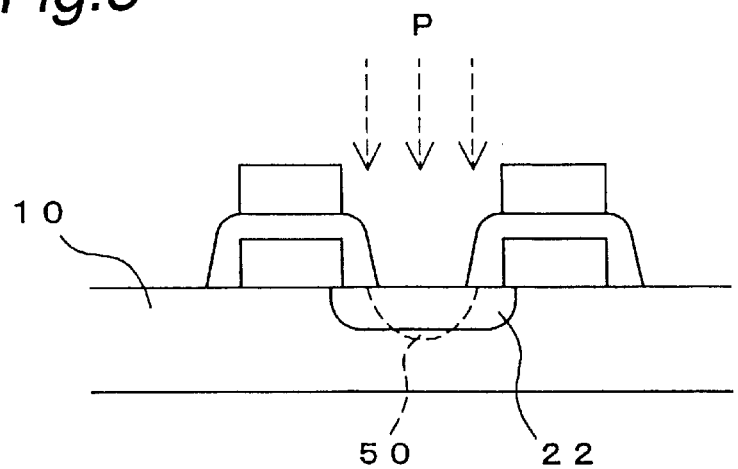
FIG. 5 is a diagram of an n region formed through the SAC injection of phosphorous (P) ions.

Then, FIG. 5 shows an n⁻ region 50 which is formed through an SAC injection of phosphorous (P) ions. The SAC injection is carried out under the energy conditions which have been conventionally carried out. Accordingly, an n⁻ region which is the same as the n⁻ regions 124-1 and 124-2 (FIG. 12) showing a conventional example is formed. The n⁻ region 50 is formed on the surface of, and within, the substrate 10 so as to overlap the n⁻ region 22.

Figure 6:
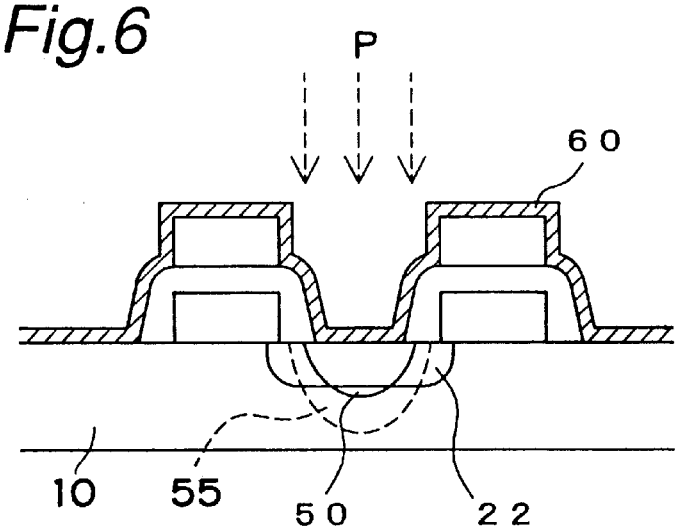
FIG. 6 is a diagram of a substrate wherein a high concentration phosphorous (P) doped polysilicon layer is, additionally, thinly deposited.

FIG. 6 shows the substrate 10, wherein a high concentration phosphorous (P) doped polysilicon layer 60 is, further, thinly deposited. The reason the high concentration phosphorous (P) doped silicon is deposited is that the direct contact resistance can be reduced because the phosphorous concentration in the interface part with the substrate 10 becomes higher. After this, phosphorous (P) ions are SAC injected with a high energy via the thinly deposited layer 60. This means that, under the condition where the thinly deposited layer 60 exists, ion injection is carried out via that layer 60. Therefore, "thin" means to be thin to the extent that phosphorous ions of a high energy can sufficiently pass through the film. Because of ion injection of a high energy, the generated n⁻ region 55 reaches more deeply into the inside of the substrate 10 than does the n⁻ region 50 which has been formed through the first SAC injection. The n⁻ region 55, like the n⁻ region 50, is also formed so as to overlap the n⁻ region 22. The important point here is that the n⁻ region 55 has a smaller diffusion in the channel direction (gate direction) because the second ion injection is carried out via the deposited layer 60. Accordingly, an ion injection of a high energy can be carried out into the substrate 10 while maintaining a punch through margin so that the junction leak can be reduced. In addition, by reducing the junction leak the refreshing characteristics in the case of usage as a DRAM are improved. More concretely, the intervals of the refreshing cycle time become longer.

Figure 7:
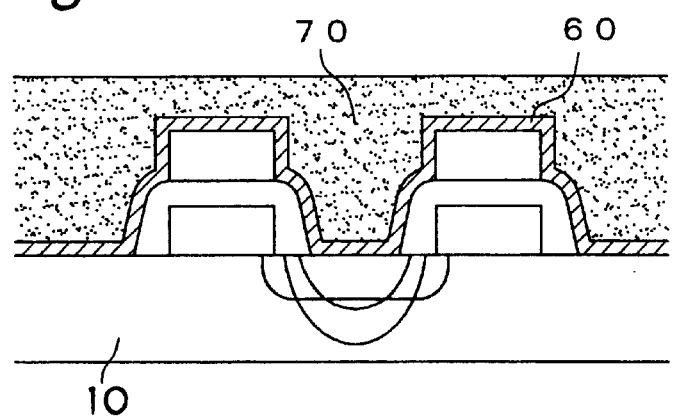
FIG. 7 is a diagram of a substrate wherein a conventional concentration phosphorous (P) doped polysilicon layer is deposited.
Figure 12:
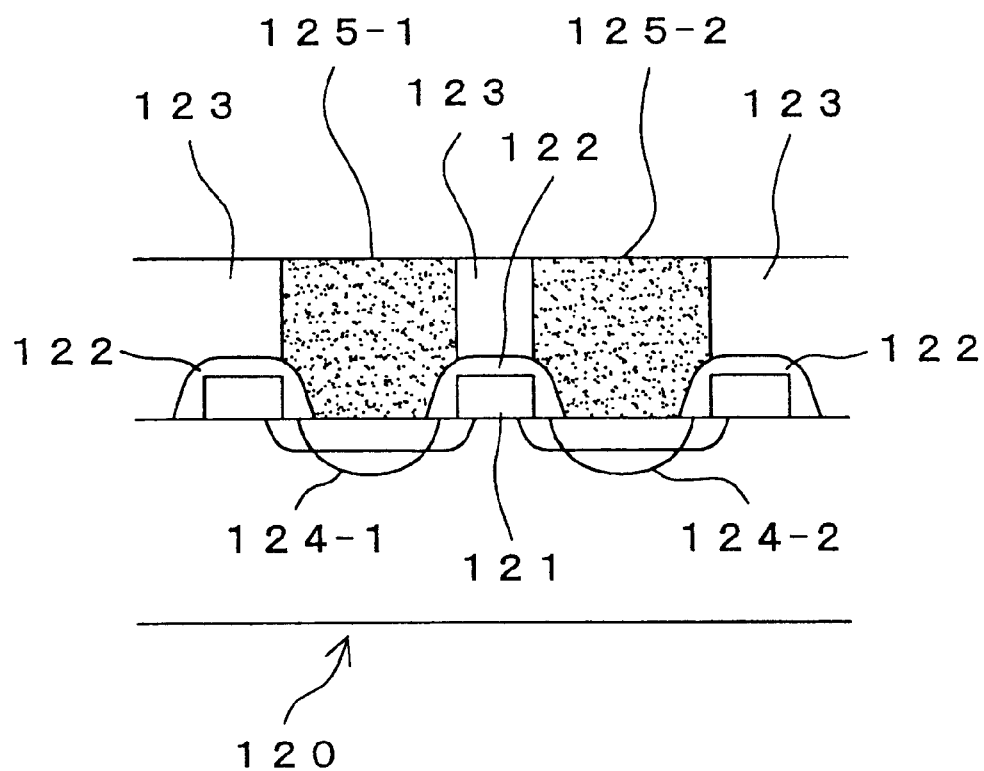
FIG. 12 is a diagram of a silicon substrate wherein polyplugs are formed according to a conventional process.

FIG. 7 shows a substrate 10 on which a conventional concentration phosphorous (P) doped polysilicon layer 70 is deposited. "Conventional concentration" is the concentration equal to that of the phosphorous (P) doped polysilicon which is used for the formation of the polyplugs 125-1 and 125-2 (FIG. 12). Here, it should be noted that the concentration of the phosphorous (P) doped polysilicon of the layer 60 is higher than the concentration of the layer 70.

Figure 8:
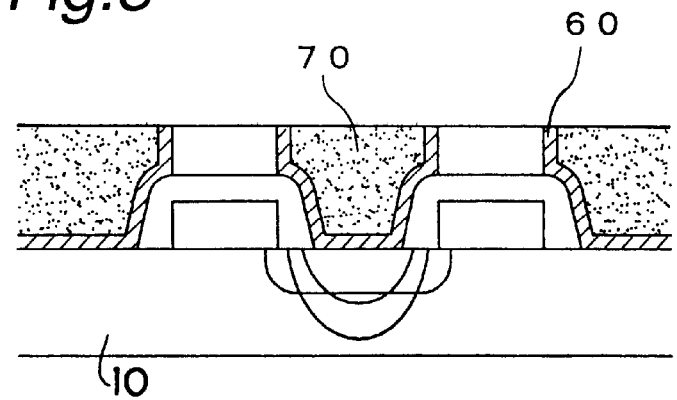
FIG. 8 is a diagram of a substrate wherein etching back is carried out on the deposited layer and, additionally, chemical and mechanical polishing is carried out.

FIG. 8 shows a substrate 10 where etching back is carried out and, additionally, chemical mechanical polishing (CMP) is carried out, on the deposited layers 60 and 70. The etching back is a method of forming an applied film on the surface where unevenness is formed and of flattening the surface of the base film (here, the layers 60 and 70) by carrying out dry etching under the condition where the etching rates of the applied film and the base film become equal.

Through the above process, the semiconductor integrated circuit device 1 (FIG. 1) can be gained. Thereby, the phosphorous concentration of the interface of the substrate 10 rises and, therefore, the direct contact resistance can be lowered. In addition, the punch through margin in the channel direction can be maintained and the junction leak can be reduced.

Hereinafter, a second embodiment of the present invention is described. A process for fabricating a semiconductor integrated circuit device of which the junction leak is reduced to a greater degree than in the first embodiment is explained. Here, the process up to FIG. 5 described in Embodiment 1 is commonly used in the process for the present embodiment, of which the description is omitted.

Figure 9:
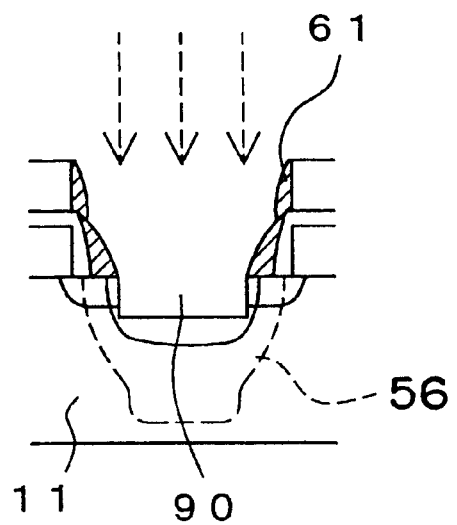
FIG. 9 is a diagram of a substrate wherein a recess is created according to Embodiment 2.

FIG. 9 shows a substrate 11 wherein a recess 90 is created according to Embodiment 2. The recess is provided for either the source or the drain in the substrate. The recess can be gained, in the same manner as in the case of FIG. 6, by thinly depositing a high concentration phosphorous (P) doped polysilicon layer 61 and by carrying out etching back. The etching back is carried out so as to form a recess in the substrate. Here, the layer 61 forms additional sidewalls. After creating a recess in the substrate 11, the second SAC injection is carried out. This SAC injection is carried out via not only the high concentration phosphorous (P) doped polysilicon layer 61, which has already been formed, but also via the recess in the substrate. Since a recess exists in the substrate 11 it is understood that the n⁻ region 56, which is formed through the second SAC injection, reaches deeper inside of the substrate 10 than the region formed through the second SAC injection in Embodiment 1. Thereby, the junction leak can be further reduced.

Figure 10:
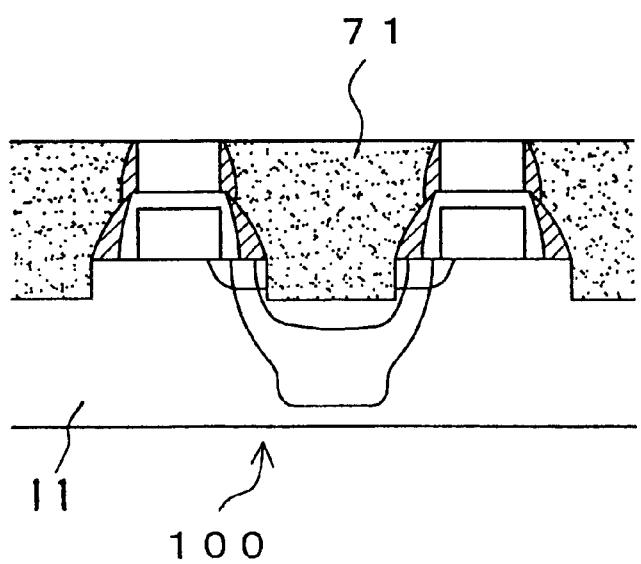
FIG. 10 is a diagram of a semiconductor integrated circuit device which uses the substrate wherein a recess is created according to Embodiment 2.

FIG. 10 shows a semiconductor integrated circuit device 100 which uses the substrate 11 wherein the recess 90 is created according to Embodiment 2. After the second SAC injection, a conventional concentration phosphorous doped polysilicon layer 71 is deposited and etching back and chemical and mechanical polishing may be carried out. Thereby, the phosphorous (P) doped polysilicon layer 71 exists, further, in the recess 90.

Figure 11:
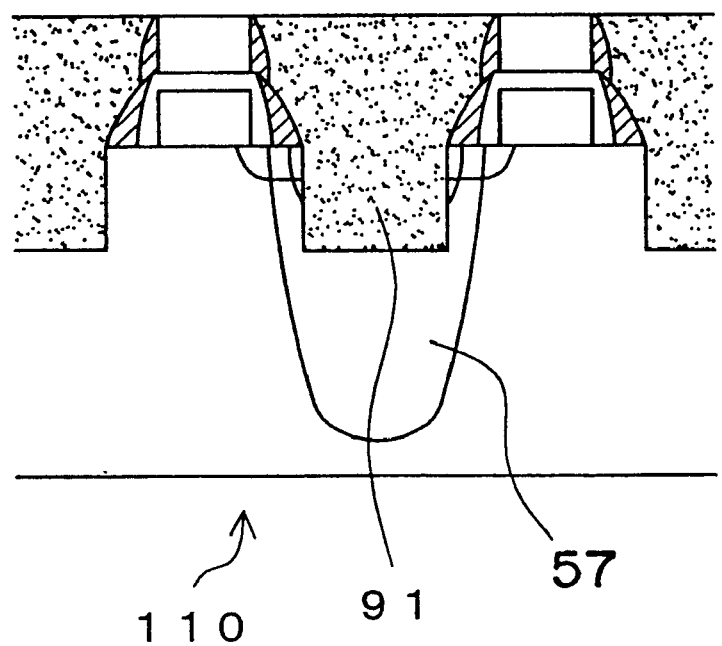
FIG. 11 is a diagram of a semiconductor integrated circuit device which has a deeper recess.

The above described substrate recess 90 (FIG. 9) may be made deeper. FIG. 11 shows a semiconductor integrated circuit device 110 which has a deeper recess 91. Since the recess 91 is deeper than the recess 90 (FIG. 9), it is understood that the n⁻ region 57, which is formed through the second SAC injection, reaches deeper inside of the substrate than in the case where the recess 90 (FIG. 9) exists. Thereby, the junction leak is further reduced. Also, at this time, the phosphorous (P) doped polysilicon layer exists, further, in the recess 91.

Embodiments of the present invention are described above. In the present specification, processes for manufacturing N channel type MOSFETs by using P type silicon substrates have been described. Those processes, however, can be applied to a process for manufacturing, for example, a CMOSFET. In this case, the above described P type silicon substrate corresponds to a P-well formed in an N type silicon substrate.

What is claimed is:

1. A semiconductor integrated circuit device comprising:
   a substrate;
   a transistor formed on said substrate, said transistor comprising a source, a drain and a gate which controls a current flowing from said source to said drain;
   an insulating layer formed over transistor and having a contact hole therein; and
   a contract plug, formed in the contact hole, which is electrically connected to one of said source and said drain and made of a conductive material including a dopant;
   wherein said contact plug is formed of at least a first layer lining the contact hole, and a second layer lining the first layer, said first layer contacting with one of said source and drain and being made of said material including the dopant of a first concentration; said second layer being made of said material including the dopant of a second concentration lower than the first concentration; and wherein one of said source and drain is a region into which ions are injected with a first energy level and with a second energy level which is higher than the first energy level, and the ions injected with said second energy level are injected via said first layer.

2. The semiconductor integrated circuit device according to claim 1, wherein a recess is formed in one of said source and drain of said substrate and the ions injected with said second energy level are injected further via said recess.

3. The semiconductor integrated circuit device according to claim 1, wherein said ions are phosphorous (P) ions.

4. The semiconductor integrated circuit device according to claim 1, wherein said material is a phosphorous (P) doped polysilicon.

5. A process for fabricating a semiconductor integrated circuit device comprising the steps of:

providing a substrate;

forming a transistor comprising a source, a drain and a gate which controls a current flowing from said source to said drain;

forming an insulating layer over the transistor;

forming a contact hole in the insulating layer;

forming a first layer made of a conductive material including a dopant of a first concentration on one of said source and drain, and lining the contact hole; and forming a second layer of said material including the dopant of a second concentration, and lining the first layer, so as to form a contact plug comprising said first and second layers, wherein said first concentration is higher than said second concentration;

wherein in said step of forming a first layer, said first layer is formed after injecting ions with a first energy level into at least one of the source and the drain; and wherein in said step of forming a contact plug, said second layer is formed after injecting ions with a second energy level which is higher than said first energy level via said first layer.

6. The process according to claim 5, wherein said step of injecting ions with a second energy level comprises the step of forming a recess in said substrate by etching one of said source and drain and, in addition, the step of injecting ions with said second energy level via said recess.

7. The process according to claim 6, wherein said ions are phosphorous ions.

8. The process according to claim 5, wherein said material is a phosphorous doped polysilicon.

9. A semiconductor integrated circuit device comprising:

a substrate;

a transistor formed on said substrate, said transistor comprising a source, a drain and a gate which controls a current flowing from said source to said drain; and a contact plug, formed in the contact hole, which is electrically connected to at least one of the source and the drain and made of a conductive material including a dopant;

wherein said contact plug is formed of at least a first layer and a second layer, said first layer contacting with one of said source and drain and being made of said material including the dopant of a first concentration; said second layer is a layer formed of a layer of said material including the dopant of a second concentration lower than the first concentration, wherein one of said source and drain is a region into which ions are injected with a first energy level and with a second energy level which is higher than the first energy level, and the ions injected with said second energy level are injected via said first layer.

10. The semiconductor integrated circuit device according to claim 9, wherein a recess is formed in one of said source and drain of said substrate and the ions injected with said second energy level are injected further via said recess.

11. A process for fabricating a semiconductor integrated circuit device comprising the steps of:

providing a substrate;

forming a transistor comprising a source, a drain and a gate which controls a current flowing from said source to said drain;

forming a first layer made of a conductive material including a dopant of a first concentration on one of said source and drain; and forming a second layer of said material including the dopant of a second concentration on said first layer so as to form a contact plug comprising said first and second layers, wherein said first concentration is higher than said second concentration, wherein in said step of forming a first layer, said first layer is formed after injecting ions with a first energy level into at least one of the source and the drain; and wherein in said step of forming a contact plug, said second layer is formed after injecting ions with a second energy level which is higher than said first energy level via said first layer.

12. The process according to claim 11, wherein said step of injecting ions with a second energy level comprises the step of forming a recess in said substrate by etching one of said source and drain and, in addition, the step of injecting ions with said second energy level via said recess.

* * * * *